US005296682A

United States Patent [19]

Wittauer et al.

[11] Patent Number: 5,296,682

[45] Date of Patent: Mar. 22, 1994

[54] AC POWER LINE VOLTAGE CONTACT PROTECTOR FOR SENSORS UNDER GLASS-CERAMIC COOKTOPS UTILIZING REJECTION FILTER

[75] Inventors: Günther Wittauer, Traunstein; Manfred Plankl, Wallersdorf, both of Fed. Rep. of Germany

[73] Assignee: Bosch-Siemens Hausgeraete GmbH, Munich, Fed. Rep. of Germany

[21] Appl. No.: 905,475

[22] Filed: Jun. 29, 1992

[30] Foreign Application Priority Data

Jun. 28, 1991 [DE] Fed. Rep. of Germany ... 9108012[U]

[51] Int. Cl.[5] ...................... F24C 15/10; H03K 17/96; H05B 3/74

[52] U.S. Cl. .................................... 219/464; 219/451; 361/113

[58] Field of Search ............... 219/464, 448, 449, 443, 219/451; 361/113

[56] References Cited

U.S. PATENT DOCUMENTS

| | | | |
|---|---|---|---|
| 1,757,658 | 5/1930 | Dubilier | 361/113 |
| 1,819,260 | 8/1931 | Peters | 361/113 |
| 2,545,760 | 3/1951 | Blanchard | 361/113 |
| 4,845,340 | 7/1989 | Goessler et al. | 219/449 |

FOREIGN PATENT DOCUMENTS

| | | | |
|---|---|---|---|
| 2831858 | 2/1980 | Fed. Rep. of Germany . | |
| 3706184 | 9/1988 | Fed. Rep. of Germany . | |
| 791504 | 12/1935 | France | 361/113 |
| 491169 | 11/1975 | U.S.S.R. | 361/113 |
| 370889 | 4/1932 | United Kingdom | 361/113 |

*Primary Examiner*—Bruce A. Reynolds
*Assistant Examiner*—John A. Jeffery
*Attorney, Agent, or Firm*—Herbert L. Lerner; Laurence A. Greenberg

[57] ABSTRACT

A cooktop assembly has a glass-ceramic cooktop, a radiant heater defining a heating zone of the cooktop, and a metal sensor disposed under the cooktop inside or outside the heating zone. A mains voltage contact protector for the sensor includes operating the sensor at a higher-frequency operating point than for normal operation, and a rejection filter being connected to the sensor and dimensioned for mains voltage contact protection.

14 Claims, 1 Drawing Sheet

AC POWER LINE VOLTAGE CONTACT PROTECTOR FOR SENSORS UNDER GLASS-CERAMIC COOKTOPS UTILIZING REJECTION FILTER

The invention relates to a mains voltage contact protector for sensors under glass-ceramic cooktops, in which a metal sensor under the glass-ceramic cooktop is disposed inside or outside a heating zone of the glass-ceramic cooktop, which is dictated by a radiant heater.

Heretofore, a temperature shutoff that served to protect heated glass-ceramic surfaces for glass-ceramic cooktops, was effected by sensors. It was unnecessary to place temperature sensors in an area surrounding the heating zone of the glass-ceramic cooktop. Metal sensors, for example for detecting pots, with the metal sensors disposed under the glass-ceramic, have not been employed before. At elevated temperatures of approximately 200° C. and above, the glass-ceramic becomes semiconducting. That means that sensors under the heating zone of the glass-ceramic cooktop must be treated as if they were physically touchable. Regulations therefore prescribe that when such sensor configurations are employed, low voltage be used for safety. To do so requires that there be considerable space under the glass-ceramic cooktop for complex insulations for electrical lines.

It is accordingly an object of the invention to provide a mains voltage contact protector for sensors under glass-ceramic cooktops, which overcomes the hereinafore-mentioned disadvantages of the heretofore-known devices of this general type and which enables the use of metal sensors under the glass-ceramic cooktop, in its heating zone, without having to use low voltage for safety.

With the foregoing and other objects in view there is provided, in accordance with the invention, in a cooktop assembly having a glass-ceramic cooktop, a radiant heater defining a heating zone of the cooktop, and a metal sensor disposed under the cooktop inside or outside the heating zone, a mains voltage contact protector for the sensor, comprising a rejection filter being connected to the sensor and dimensioned for mains voltage contact protection, or in other words for electric shock protection, and the sensor operating at a higher-frequency operating point than for normal operation.

In accordance with another feature of the invention, the rejection filter is a low-pass filter.

In accordance with a further feature of the invention, the low-pass filter is a grounded choke.

In accordance with an added feature of the invention, the rejection filter is a parallel oscillating circuit tuned to a sensor operating frequency.

In accordance with a concomitant feature of the invention, the parallel oscillating circuit has a choke in the form of a transformer.

Although the invention is illustrated and described herein as embodied in a mains voltage contact protector for sensors under glass-ceramic cooktops, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
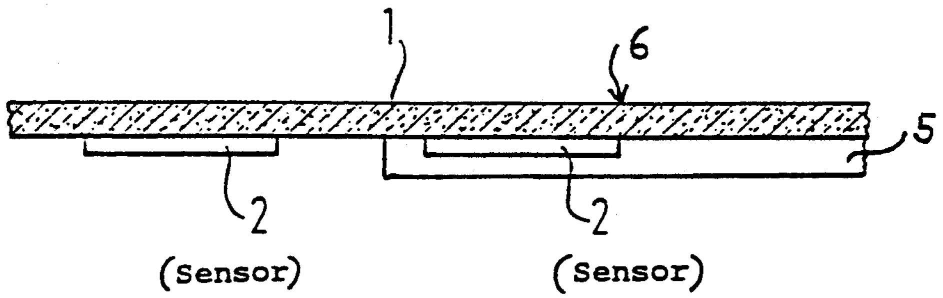
FIG. 1 is a fragmentary, diagrammatic, longitudinal-sectional view of a basic configuration of sensors under a glass-ceramic surface.

Referring now to the figures of the drawing in detail and first, particularly, to FIG. 1 thereof, there is seen a glass-ceramic cooktop 1 as well as sensors 2 disposed under the cooktop. Radiant heaters 5 increase the electrical conductivity of the glass-ceramic cooktop 1 to the point of semiconduction, and therefore can also lead to heating zones 6 on the glass-ceramic cooktop within their radiation range, because of reduced thermal conductivity transversely of the glass-ceramic cooktop. The sensors 2 may, for instance, serve to detect the presence of pots. A pot that is or is not placed on the cooktop causes overall capacitive changes on the glass-ceramic cooktop 1 along the sensor range.

Figure 2:
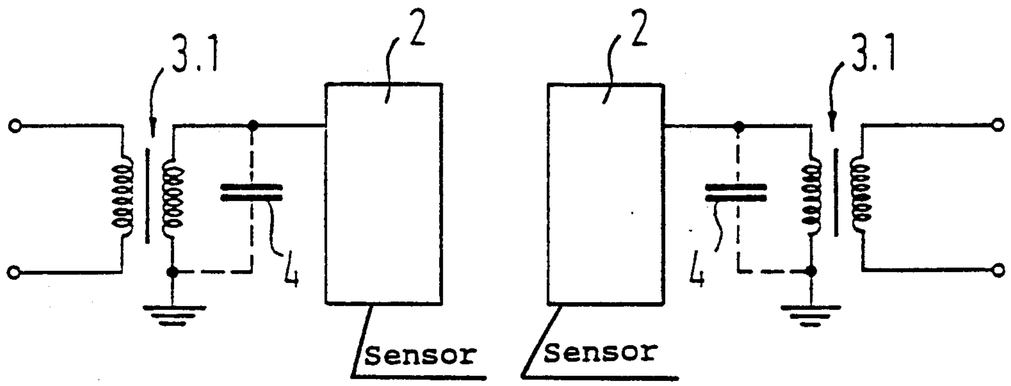
FIG. 2 is a schematic and block circuit diagram for the sensor according to the invention.

FIG. 2 shows one wiring layout of the sensor 2, with an oscillating circuit made up of a transformer 3.1 and a capacitor 4. The oscillating circuit acts as a rejection filter and its resonant frequency is tuned to the sensor operation frequency, which is far above the mains frequency. As a result, the mains frequency can be conducted to ground through this low-pass filter.

Figure 3:
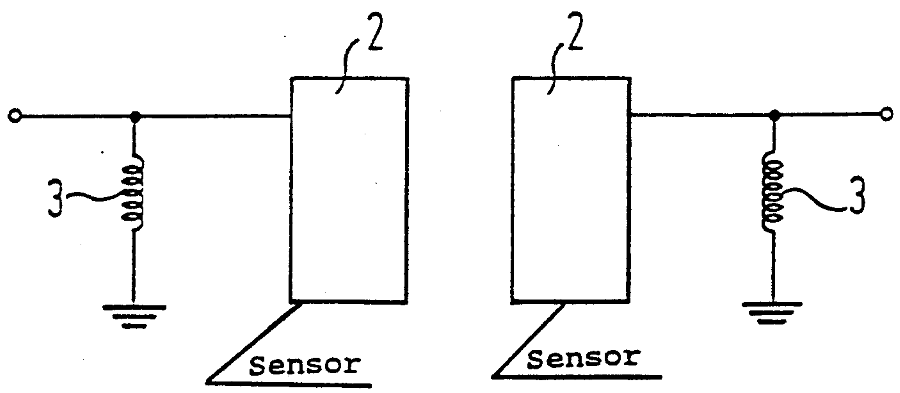
FIG. 3 is a view similar to FIG. 2 for the sensor with a low-pass filter.

FIG. 3 shows the sensor 2 wired with an inductance (choke) 3. Due to the grounding through this grounded choke 3, impermissible voltages at the sensors 2, such as the mains voltage, are dissipated. In the case of higher frequencies, the choke blocks, so that the sensor signal is not dissipated. This effect can be even further reinforced by the layout of a parallel oscillating circuit as shown in FIG. 2. If the rejection filter is constructed as a parallel oscillating circuit, then it is practical to construct the choke 3 as a transformer 3.1. This simultaneously simplifies coupling and decoupling of the sensor signal.

We claim:

1. In a cooktop assembly having a glass-ceramic cooktop, a radiant heater defining a heating zone of the cooktop, and a metal sensor disposed under the cooktop, a mains voltage contact protector for the sensor, comprising a rejection filter being connected to the sensor and dimensioned for mains voltage contact protection, and the sensor operating at a higher-frequency operating point than for normal operation.

2. The mains voltage contact protector according to claim 1, wherein the metal sensor is disposed inside the heating zone.

3. The mains voltage contact protector according to claim 1, wherein the metal sensor is disposed outside the heating zone.

4. The mains voltage contact protector according to claim 1, wherein said rejection filter is a low-pass filter.

5. The mains voltage contact protector according to claim 4, wherein said low-pass filter is a grounded choke.

6. The mains voltage contact protector according to claim 1, wherein said rejection filter is a parallel oscillating circuit tuned to a sensor operating frequency.

7. The mains voltage contact protector according to claim 5, wherein said parallel oscillating circuit has a choke in the form of a transformer.

8. A cooktop assembly, comprising a glass-ceramic cooktop, a radiant heater defining a heating zone of said cooktop, a metal sensor disposed under said cooktop, and a mains voltage contact protector for said sensor including a rejection filter being connected to said sensor and dimensioned for mains voltage contact protection, and said sensor operating at a higher-frequency operating point than for normal operation.

9. The cooktop assembly according to claim 8, wherein the metal sensor is disposed inside the heating zone.

10. The cooktop assembly according to claim 8, wherein the metal sensor is disposed outside the heating zone.

11. The cooktop assembly according to claim 8, wherein said rejection filter is a low-pass filter.

12. The cooktop assembly according to claim 11, wherein said low-pass filter is a grounded choke.

13. The cooktop assembly according to claim 8, wherein said rejection filter is a parallel oscillating circuit tuned to a sensor operating frequency.

14. The cooktop assembly according to claim 13, wherein said parallel oscillating circuit has a choke in the form of a transformer.

* * * * *